US009425070B2

(12) United States Patent
Harada et al.

(10) Patent No.: US 9,425,070 B2
(45) Date of Patent: Aug. 23, 2016

(54) SEMICONDUCTOR DEVICE AND A METHOD OF MANUFACTURING THE SAME

(75) Inventors: Yoshimichi Harada, Kanagawa (JP); Makoto Murai, Oita (JP); Takayuki Tanaka, Oita (JP); Kana Nagayoshi, Oita (JP); Takuya Nakamura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 259 days.

(21) Appl. No.: 13/005,841

(22) Filed: Jan. 13, 2011

(65) Prior Publication Data
US 2011/0175239 A1  Jul. 21, 2011

(30) Foreign Application Priority Data

Jan. 20, 2010 (JP) ................... 2010-010091

(51) Int. Cl.
H01L 23/48 (2006.01)
H01L 21/56 (2006.01)
(52) U.S. Cl.
CPC ..... *H01L 21/563* (2013.01); *H01L 2224/16225* (2013.01); *H01L 2224/32225* (2013.01); *H01L 2224/73203* (2013.01); *H01L 2224/73204* (2013.01); *H01L 2924/01012* (2013.01); *H01L 2924/01019* (2013.01)
(58) Field of Classification Search
CPC ........... H01L 2224/16225; H01L 2224/32225; H01L 2224/73204; H01L 2924/00; H01L 2924/01012; H01L 2924/01019
USPC .............. 257/782, E23.01, E21.499; 438/106
See application file for complete search history.

(56) References Cited

U.S. PATENT DOCUMENTS

| 2004/0043534 | A1* | 3/2004 | Yamashita | H01L 21/563 438/108 |
| 2006/0046352 | A1* | 3/2006 | Low | H01L 21/563 438/127 |
| 2006/0160347 | A1* | 7/2006 | Nakayama | H01L 21/4853 438/612 |
| 2008/0211111 | A1* | 9/2008 | Park | H01L 21/563 257/778 |
| 2010/0181680 | A1* | 7/2010 | Harada | H01L 21/563 257/773 |

FOREIGN PATENT DOCUMENTS

| JP | 2003-324182 | 11/2003 |
| JP | 2005-276879 | 10/2005 |
| JP | 2007-173361 | 7/2007 |

OTHER PUBLICATIONS

Official Action (with English translation) for Chinese Patent Application No. 201210175731.0 dated Dec. 5, 2014, 11 pages.

* cited by examiner

*Primary Examiner* — Vongsavanh Sengdara
(74) *Attorney, Agent, or Firm* — Chip Law Group

(57) ABSTRACT

Disclosed herein is a semiconductor device, including: a mount body having a first principal surface on which a wiring pattern is formed; a semiconductor chip mounted above the principal surface of the mount body on which the wiring pattern is formed; an underfill material filled between the mount body and the semiconductor chip, thereby forming a fillet in an outer peripheral portion of the semiconductor chip; and an introduction portion formed outside a side portion, along which the fillet is formed so as to be longest, of four side portions which measure a chip mounting area, on the mount body, onto which the semiconductor chip is mounted, the introduction portion serving to introduce the underfill material between the mount body and the semiconductor chip.

12 Claims, 15 Drawing Sheets

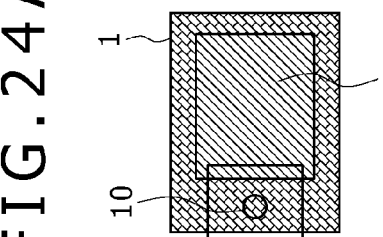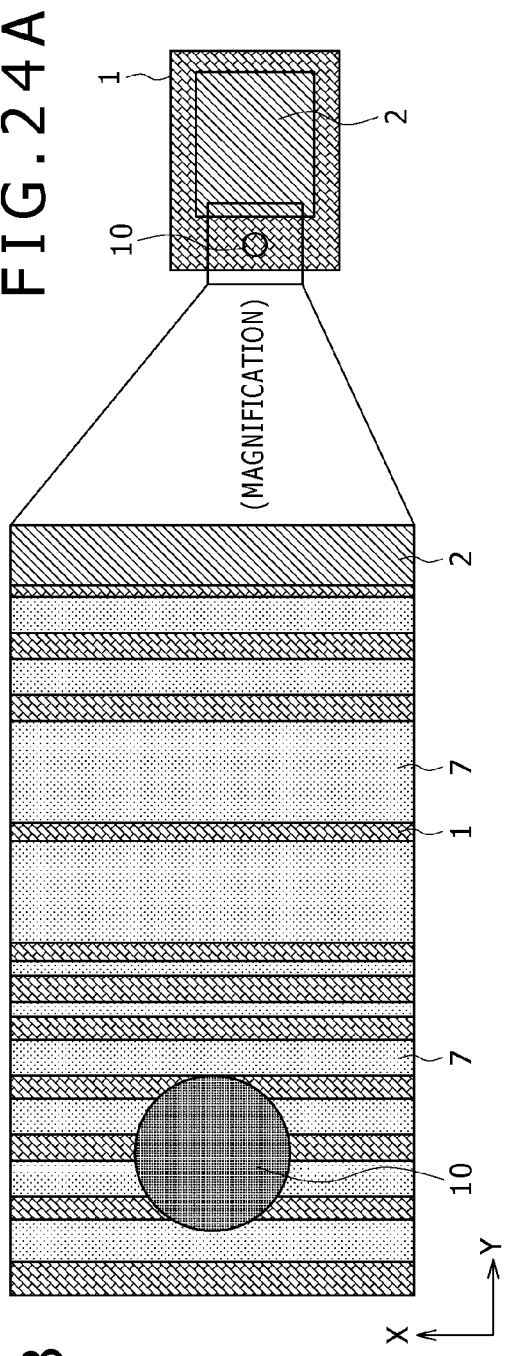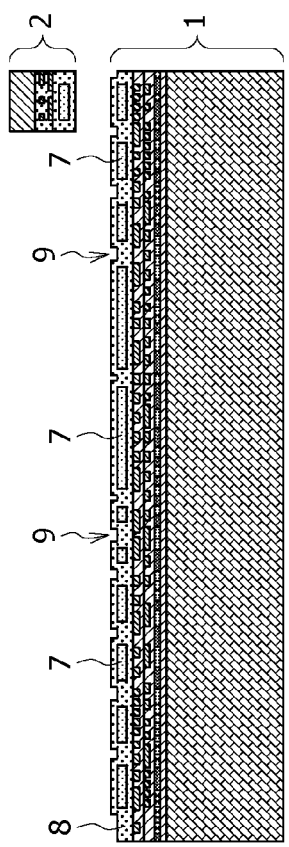

SEMICONDUCTOR DEVICE AND A METHOD OF MANUFACTURING THE SAME

BACKGROUND OF THE INVENTION

1. Field of the Invention

The present invention relates to a semiconductor device and a method of manufacturing the same, and more particularly to a semiconductor device having such a structure that a semiconductor chip is mounted on a mount body, and a method of manufacturing the same.

2. Description of the Related Art

The problems such as reduction in yield, an increase in mounting area, and high-cost promotion have been serious along with the high integration promotion, the high performance promotion and the high function promotion of the LSIs (Large Scale Integration). In recent years, a System-in-Package (SiP) in which these problems and the LSI performance can be made compatible with each other has attracted attention. The SiP can be classified into various kinds of structures such as a package lamination type one, a chip stack type one, and a Chip-on-Chip type one. In particular, the Chip-on-Chip type SiP has an advantage to speed up the operation and to reduce the power consumption because the Chip-on-Chip type SiP allows chips to undergo multiple pin connection with a short wiring length.

The Chip-on-Chip type SiP, for example, is realized by connecting a memory chip and a logic circuit chip to each other through micro-bumps formed on the chips with active surfaces of the chips being made to face each other on a Face-to-face basis.

Normally, in the Chip-on-Chip type SiP, a liquid resin called an underfill material is enclosed in an air gap defined between the chips connected to each other through the bumps for the purpose of protecting the bumps. The underfill material, for example, is enclosed in the air gap defined between the chips by utilizing a method as shown in FIG. 21. This method, for example, is described in Japanese Patent Laid-Open No. 2005-276879. That is to say, a first semiconductor chip 1 and a second semiconductor chip 2 (including diffusion layers, transistors, a wiring layer and the like (not shown)) are connected to each other through bumps 3. In this state, an underfill material 5 is supplied by using a needle 4. At this time, the underfill material 5 is dropped onto a position on a surface of the first semiconductor chip 1 and in the vicinity of the semiconductor chip 2. As a result, the underfill material 5 wetly spreads on the surface of the first semiconductor chip 1 to reach an end portion of the second semiconductor chip 2, and then penetrates from the end portion to an air gap defined between the first semiconductor chip 1 and the second semiconductor chip 2 by a capillary action. In addition, the underfill material 5 which has penetrated by the capillary action, as shown in FIGS. 22A and 22B, forms a fillet 6 which spreads toward bottom in an outer peripheral portion of the second semiconductor chip 2. After that, the underfill material 5 is cured by carrying out a heat treatment. As a result, each of the bumps 3 is prevented from cracking due to concentration of a stress, and an influence of an external stress such as moisture absorption is relaxed, thereby ensuring the reliability of the correction between the upper chip and the lower chip.

SUMMARY OF THE INVENTION

The process for enclosing the underfill material is carried out by utilizing the following phenomena (1) to (3).
(1) Dropping of the underfill material 5.

(2) The phenomenon in which the underfill material 5 dropped onto the position on the surface of the first semiconductor chip 1 wetly spreads on the first semiconductor chip 1.

(3) The phenomenon in which the underfill material which wetly spreads on the surface of the first semiconductor chip 1 penetrates to the air gap defined between the first semiconductor chip 1 and the second semiconductor chip 2 by the capillary action.

In this case, in order that the underfill material 5 may penetrate to the air gap defined between the first semiconductor chip 1 and the second semiconductor chip 2 without generating any of the voids in the air gap between the chips 1 and 2, preferably, the wetly spreading property of the surface of the first semiconductor chip 1 is high, in a word, a surface tension of the first semiconductor chip 1 is small. In addition, in order that the underfill material 5 may uniformly penetrate without generating any of the voids, preferably, a portion which is poor in wetly spreading property does not partially exist.

On the other hand, as shown in FIG. 23, a stepped portion 9 is formed on a surface of the first semiconductor chip 1 by a passivation film 8 covering a wiring pattern 7 composing an uppermost layer of an LSI depending on the patterns of the LSI. In particular, as shown in FIGS. 24A, 24B and 24C, when the wiring pattern 7 composing the uppermost layer is formed vertically to a penetration direction Y of the underfill material 5, the stepped portion 9 of the passivation film 8 is formed in parallel with the wiring pattern 7. For this reason, a flow property of the underfill material 5 is impeded by the surface tension in the stepped portion 9 of the passivation film 8. Therefore, for example, a speed and an amount by which the underfill material 5 reaches the end portion of the second semiconductor chip 2 disperse every chip due to a manufacture dispersion of the first semiconductor chip 1. As a result, for example, as shown in FIG. 25, voids 11 are induced in the air gap defined between the second semiconductor chip (upper chip) 2 and the first semiconductor chip (lower chip) 1, which becomes a factor for deterioration of the reliability of the connection portion.

In addition, when the flow property of the underfill material 5 is impeded, a balance among the phenomena (1) to (3) described above is lost in the process for enclosing the underfill material 5. For this reason, for example, an amount of underfill material 5 which is dropped from the needle 4 becomes excessive as compared with the case of the underfill material 5 which wetly spreads on the surface of the first semiconductor chip 1 or the case of the underfill material 5 which penetrates to the air gap defined between the first semiconductor chip 1 and the second semiconductor chip 2 in some cases. In such cases, as shown in FIG. 25, a stranding (crawling-up) 12 of the underfill material 5 on the second semiconductor chip 2 is generated in the vicinity of a supply area 10. As a result, there is also encountered such a problem that the voids 11 are generated in the air gap defined between the upper chip 2 and the lower chip 1 in which the underfill material 5 should be filled, and the reliability of the connection portion is deteriorated. In addition, there is also caused such a problem that a lack of the filling of the underfill material 5 is generated along with the generation of the stranding 12.

In particular, recently, from a request for the enhancement of the integration technique, and the miniaturization of the LSI, the further miniaturization of the first semiconductor chip 1 is being studied in the Chip-on-Chip type semiconductor device (SiP). For this reason, even when a defined amount of underfill material 5 is supplied so as to correspond to the chip size of the second semiconductor chip 2, the supply area 10 needs to be set so as to be approached to the vicinity of the second semiconductor chip 2. As a result, for example, the capillary action acts between the end surface of the second semiconductor chip 2 and the needle 4, thereby providing a situation in which the stranding 12 described above is easy to further generate.

In addition, recently, the chip laminating technique has been developed, and thus three or more semiconductor chips (such as the LSI chips) are stacked one upon another in multistage to be accommodated in one package in many cases. When a third semiconductor chip (not shown) is laminated on the second semiconductor chip 2 mounted onto the first semiconductor chip 1 in the Chip-on-Chip structure in the manner as described above, the stranding 12 of the underfill material 5 becomes an obstacle. Specifically, as shown in FIG. 26, the generation of the stranding 12 of the underfill material 5 results in that an inclination is generated in a pose of the third semiconductor chip 13 laminated on the second semiconductor chip 2, or the adhesiveness between the chips becomes worse. In addition, when the first and second semiconductor chips 1 and 2 are encapsulated together with the laminated third semiconductor chip 13 with a resin, a thickness of the resin overlying the third semiconductor chip 13 disperses, and thus the lack of the filling of the resin is generated. For this reason, the reduction in yield and reliability is caused.

The present invention has been made in order to solve the problems described above, and it is therefore desirable to provide a semiconductor device which has such a structure that a semiconductor chip is mounted onto a mount body, and in which a stranding of an underfill material on a semiconductor chip, and voids can be each prevented from being generated, and a method of manufacturing the same.

In order to attain the desire described above, according to an embodiment of the present invention, there is provided a semiconductor chip including: a body, to which an object is to be mounted, having a first principal surface on which a wiring pattern is formed; a semiconductor chip mounted above the principal surface of the mount body on which the wiring pattern is formed; an underfill material filled between the mount body and the semiconductor chip, thereby forming a fillet in an outer peripheral portion of the semiconductor chip; and an introduction portion formed outside a side portion, along which the fillet is formed so as to be longest, of four side portions which measure a chip mounting area, on the mount body, onto which the semiconductor chip is mounted, the introduction portion serving to introduce the underfill material between the mount body and the semiconductor chip.

In the semiconductor device according to the embodiment of the present invention, the underfill material which has been supplied onto the mount body in the manufacturing process for the semiconductor device is introduced to the side portion (chip end) of the semiconductor chip through the introduction portion. In addition, the underfill material which has reached the side portion of the semiconductor chip penetrates to the air gap defined between the mount body and the semiconductor chip by the capillary action, and forms the fillet in the outer peripheral portion of the semiconductor chip.

According to another embodiment of the present invention, there is provided a method of manufacturing a semiconductor device including the steps of: forming an introduction portion outside a side portion, closest to a supply area onto which an underfill material is supplied, of four sides which measure a chip mounting area onto which a semiconductor chip is mounted on a wiring pattern formed on a first principal surface of a mount body; mounting the semiconductor chip on the chip mounting area of the mount body; and filling the underfill material between the mount body and the semiconductor chip through the introduction portion, thereby forming a fillet in an outer peripheral portion of the semiconductor chip.

In the method of manufacturing a semiconductor device according to the embodiment of the present invention, after the semiconductor chip is mounted, the underfill material is supplied onto the supply area on the mount body in order to fill the underfill material between the mount body and the semiconductor chip. As a result, the underfill material is introduced to the side portion (chip end) of the semiconductor chip through the introduction portion on the mount body. In addition, the underfill material which has reached the side portion of the semiconductor chip penetrates between the mount body and the semiconductor chip by the capillary action, and forms the fillet in the outer peripheral portion of the semiconductor chip.

According to the present invention, in the semiconductor device having such a structure that the semiconductor chip is mounted onto the mount body, the stranding of the underfill material on the semiconductor chip and the voids can be both prevented from being generated. For this reason, it is possible to enhance the reliability of connection, and the yield of the semiconductor device.

BRIEF DESCRIPTION OF THE DRAWINGS

FIGS. 24A, 24B and 24C are an entire top plan view, an enlarged top plan view, and a cross sectional view, respectively, each showing a supply area for the underfill material, and a surface state of the semiconductor chip;

DETAILED DESCRIPTION OF THE PREFERRED EMBODIMENTS

Figure 1A:
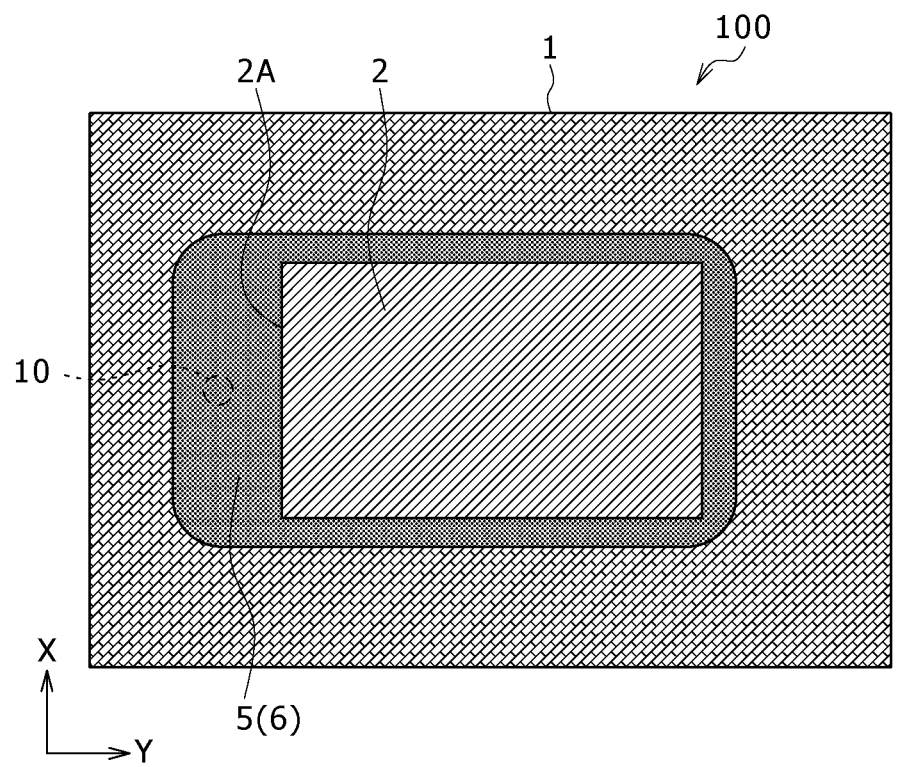
FIGS. 1A and 1B are a top plan view and a sectional side elevation view, respectively, each showing a structure of a semiconductor device according to an embodiment of the present invention.

Preferred embodiments of the present invention will be described in detail hereinafter with reference to the accompanying drawings. It is noted that the technical scope of the present invention is by no means limited to embodiments which will be described below, and thus forms are also contained in which various kinds of changes and improvements are made in a range in which specific effects obtained by the constitutional requirements of the invention and combinations thereof can be derived.

The embodiments of the present invention are described in accordance with the following order. In addition, in the embodiments, the same portions as those described with reference to FIGS. 21 to 26 are designated by the same reference numerals, respectively, for the following description.

1. Embodiment Mode (Structure of Semiconductor Device)
2. First Embodiment
3. Second Embodiment
4. Third Embodiment
5. Fourth Embodiment
6. Fifth Embodiment
7. Sixth Embodiment
8. Seventh Embodiment
9. Eighth Embodiment
10. Ninth Embodiment
11. Changes

1. Embodiment Mode

Structure of Semiconductor Device

Figure 1B:
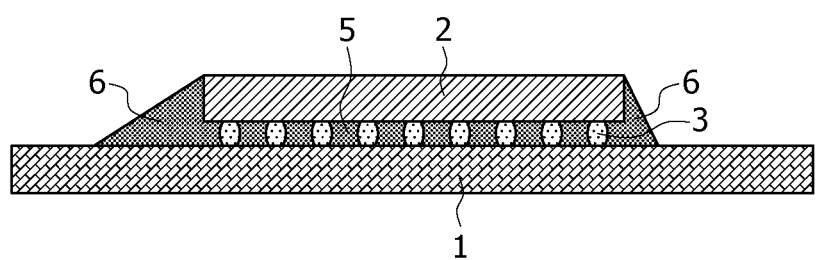

FIGS. 1A and 1B are a top plan view and a sectional side elevation view, respectively, each showing a structure of a semiconductor device according to an embodiment of the present invention. The semiconductor device 100 shown in FIGS. 1A and 1B has such a structure as to include a first semiconductor chip 1 and a second semiconductor chip 2. The first semiconductor chip 1 and the second semiconductor chip 2 may be chips which have functionally any functions, respectively. For example, one of the first semiconductor chip 1 and the second semiconductor chip 2 may be a memory chip, and the other may be a logic circuit chip. Or, the first semiconductor chip 1 and the second semiconductor chip 2 may also be chips having other functions, respectively. In addition, in this case, although a description is given by exemplifying a Chip-on-Chip type semiconductor device having the first semiconductor chip 1 used as a mount body, the present invention is by no means limited thereto. That is to say, an interconnection substrate (such as a silicon interposer substrate) (not shown) may also be used as the mount body.

Each of the first semiconductor chip 1 and the second semiconductor chip 2 is formed so as to have a quadrangle (such as a rectangle or a square) in terms of planar view. The first semiconductor chip 1 has a larger external size than that of the second semiconductor chip 2. A semiconductor element (such as a transistor) (not shown) is formed on a principal surface the first semiconductor chip 1, and a semiconductor element (not shown) is formed on a principal surface as well of the second semiconductor chip 2. The first semiconductor chip 1 and the second semiconductor chip 2 are electrically and mechanically connected to each other through bumps 3 with their principal surfaces (element formation surfaces) being made to face each other. Solder bump, for example, made of a tin (Sn)-silver (Ag) alloy is used as each of the bumps 3.

Figure 2:
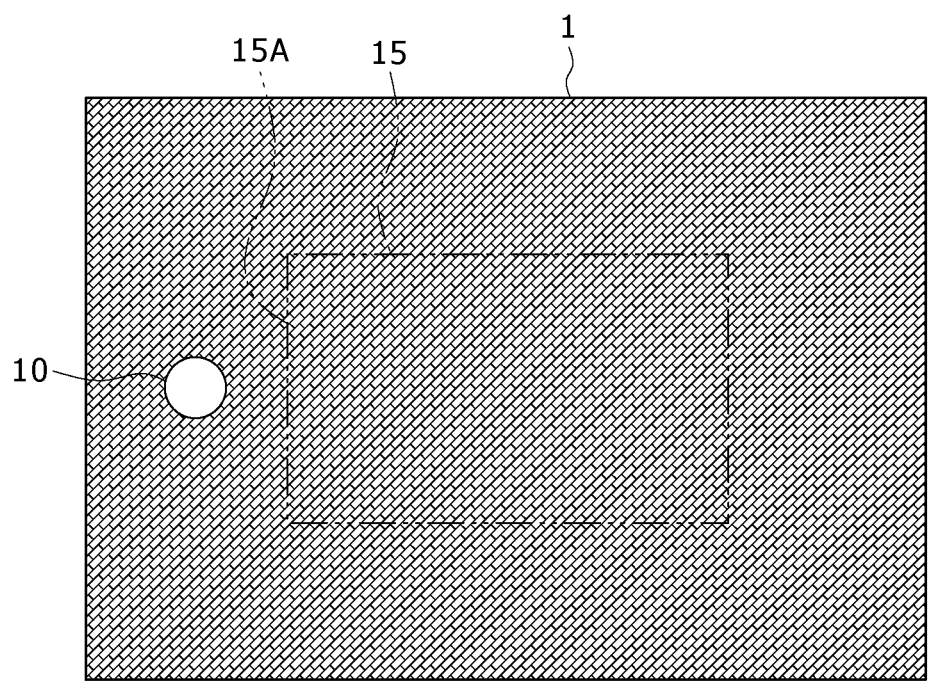
FIG. 2 is a top plan view showing positions of a supply area for an underfill material, and a chip mounting area which are set on a first semiconductor chip shown in FIGS. 1A and 1B.

The second semiconductor chip 2 is mounted onto the first semiconductor chip 1. As shown in a top plan view of FIG. 2, a chip mounting area 15 onto which the second semiconductor chip 2 is intended to be mounted is set on a principal surface (element formation surface) of the first semiconductor chip 1. The chip mounting area 15, for example, is set in a central portion of the element formation surface of the first semiconductor chip 1. The second semiconductor chip 2 is mounted onto the first semiconductor chip 1 so as for its portion to correspond to the chip mounting area 15.

An underfill material 5 is filled in an air gap defined between the first semiconductor chip 1 and the second semiconductor chip 2. The underfill material 5 is filled in a portion through which the first semiconductor chip 1 and the second semiconductor chip 2 face each other. The underfill material 5 is provided, for example, for prevention of generation of cracking of each of the bumps 3 due to concentration of a stress, relaxation of an influence of an external stress such as moisture absorption, mechanical protection of each of the bumps 3, prevention of electrical short-circuit due to melting of a solder material composing each of the bumps 3, and the like. The underfill material 5, for example, is made of a thermosetting resin such as an epoxy resin.

The underfill material 5 forms fillets 6 in an outer peripheral portion of the second semiconductor chip 2. The fillet 6 is formed so as to spread toward a bottom in a state in which the fillets 6 cover end surfaces of the second semiconductor chip 2 from four side portions regulating the outer peripheral portion of the second semiconductor chip 2. When lengths of the fillets 6 in the four side portions of the second semiconductor chip 2 are compared with one another, the length of the fillet 6 formed in the side portion 2A closest to the supply area 10 onto which the sidewall material 5 is supplied on the first semiconductor chip 1 in a process for manufacturing the semiconductor device 100 is longest. The reason for this is because the underfill material 5 wetly spreads on the first semiconductor chip 1 with the supply area 10 as a starting point in the side portion 2A of the second semiconductor chip 2 closest to the supply area 10 for the underfill material 5, whereby the fillet 6 is formed in a wider range than that of any of other side portions. The length of the fillet 6 is regulated in the form of a size from the side portion of the second semiconductor chip 2 to the end of the fillet 6 when the semiconductor device 100 is planarly viewed.

Figure 3:
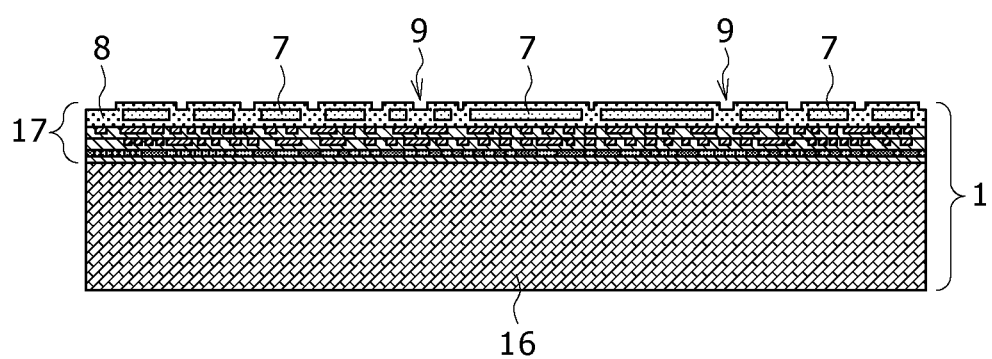
FIG. 3 is a cross sectional view showing a structure of the first semiconductor chip.

FIG. 3 is a cross sectional view of the first semiconductor chip 1. The first semiconductor chip 1, for example, is structured with a semiconductor substrate 16 such as a silicon substrate as a base. A multilayer wiring layer 17 composed of a plurality of wiring layers is formed on a principal surface side of the semiconductor substrate 16. The multilayer wiring layer 17, for example, is formed by laminating a wiring layer made of a wiring material such as copper or aluminum, and an interlayer insulating layer made of a wiring material made of an insulating material such as a silicon oxide or a silicon nitride. For formation of a wiring pattern of the wiring layer formed in a lower layer than the uppermost layer in the multilayer wiring layer 17, for example, copper is used as the wiring material. On the other hand, for formation of a wiring pattern 7 of the wiring layer formed as the uppermost layer in the multilayer wiring layer 17, for example, aluminum or an alloy containing therein aluminum as a major component (an alloy obtained by mixing aluminum with a small amount of copper) is used as the wiring material. The wiring pattern 7 is formed on a surface layer portion of the first semiconductor chip 1. In addition, the wiring pattern 7, for example, is formed under a condition that a wiring width is 30 μm, a gap between the wirings is 4 μm, and a thickness of the wiring is 1.1 μm.

The wiring pattern 7 is covered with a passivation film 8. The passivation film 8, for example, is formed in the form of a lamination film having a silicon oxide film and a silicon nitride film laminated on top of each other. The passivation film 8, for example, is formed in the form of the lamination film of the silicon oxide film having a thickness of 500 nm and the silicon nitride film having a thickness of 700 nm. A stepped portion 9 is formed on a surface of the passivation film 8 so as to correspond to a position of formation of the wiring pattern 7. The passivation film 8 becomes concave in a portion of formation of the wiring pattern 7, and the passivation film 8 becomes convex between the wiring patterns 7, thereby forming the stepped portion 9 within a surface of the first semiconductor chip 1.

2. First Embodiment

Figure 4:
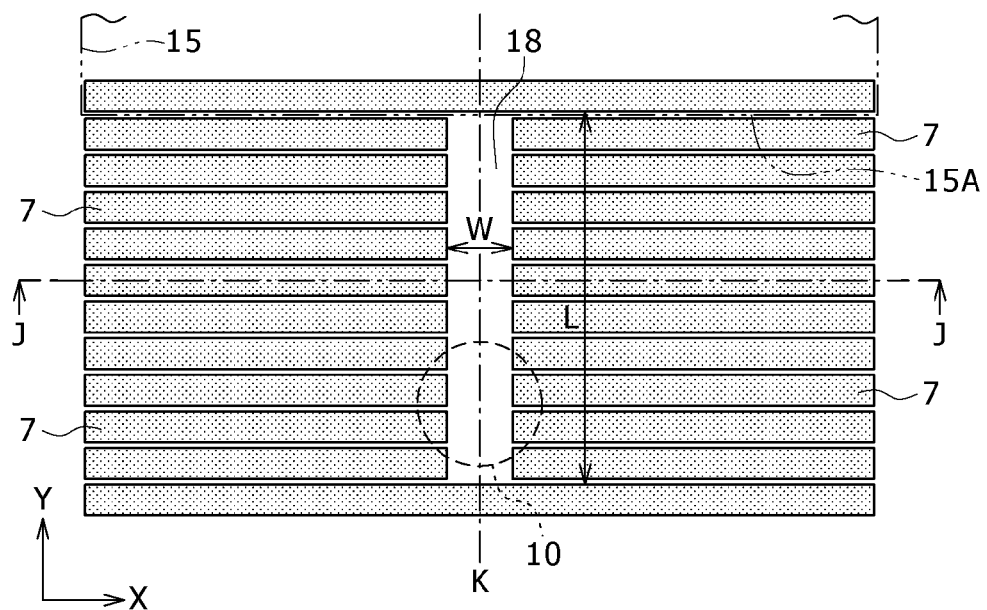
FIG. 4 is an enlarged top plan view of a part of an element formation surface of the first semiconductor chip before a second semiconductor chip is mounted in a structure of a semiconductor device according to a first embodiment of the present invention.
Figure 5:
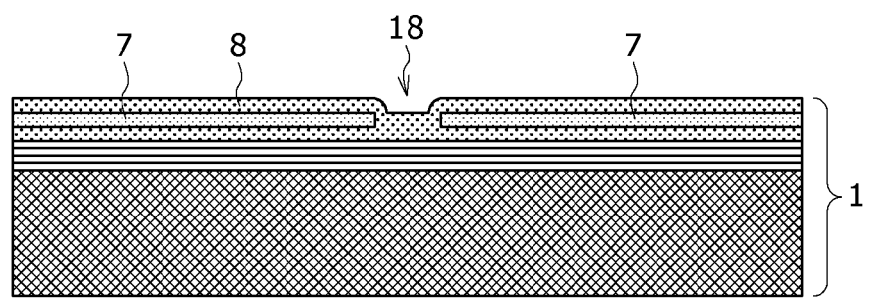
FIG. 5 is a cross sectional view taken on line J-J of FIG. 4.

FIG. 4 is an enlarged top plan view of a part of the element formation surface of the first semiconductor chip 1 before the second semiconductor chip 2 is mounted in a structure of a semiconductor device according to a first embodiment of the present invention. In addition, FIG. 5 is a cross sectional view taken on line J-J of FIG. 4. As shown in FIGS. 4 and 5, as described above, the chip mounting area 15 is set within the element formation surface of the first semiconductor chip 1. The chip mounting area 15 is measured as a quadrangle in terms of planar view so as to correspond to the external shape of the second semiconductor chip 2. The supply area 10 for the underfill material 5 is set in the vicinity of one side portion 15A of four side portions with which the chip mounting area 15 is measured. A plurality of wiring patterns 7 described above are formed outside and inside the chip mounting area 15 in a direction parallel with the side portion 15A of the chip mounting area 15. Each of the wiring patterns 7 composes the wiring layer as the uppermost layer in the multilayer wiring layer 17 described above. The supply area 10 for the underfill material 5 is set in a position at a predetermined distance from the side portion 15A of the chip mounting area 15 toward the chip end side of the first semiconductor chip 1. For example, when the underfill material 5 is dropped and supplied from the needle 4 of a dispenser in the manner described above, the predetermined distance is set as a size which is larger than at least the external size of the needle 4. For this reason, the underfill material 5 which has been supplied onto the supply area 10 penetrates from the side portion 2A of the semiconductor chip 2 mounted so as to correspond to the side portion 15A of the chip mounting area 15 to the air gap defined between the first semiconductor chip 1 and the second semiconductor chip 2 by the capillary action.

Here, a wiring direction (length direction) of each of the wiring patterns 7 is defined as an X direction, and a direction orthogonal to the X direction within the plane of the first semiconductor chip 1 is defined as a Y direction. In such a case, the underfill material 5 which has been supplied onto the supply area 10 flows in the Y direction when viewed from the supply area 10 to reach the side portion 2A of the second semiconductor chip 2, thereby penetrating to the air gap defined between the first semiconductor chip 1 and the second semiconductor chip 2 from the side portion 2A. On the other hand, an introduction portion 18 is provided on the element formation surface of the first semiconductor chip 1 so as to extend in the Y direction. The introduction portion 18 is formed in order to introduce the underfill material 5 which has been supplied onto the supply area 10 on the first semiconductor chip 1 to the air gap defined between the first semiconductor chip 1 and the second semiconductor chip 2 in the process for manufacturing the semiconductor device 100. The introduction portion 18 is formed outside the side portion 15A, along which the fillet 6 is formed so as to be longest, of the four side portions which measure the chip mounting area 15. The wording "the outside of the side portion 15A" described herein means an area which contains a position planarly overlapping the side portion 15A, and extends up to the fillet end on the end side of the first semiconductor chip 1 when viewed from the side portion 15A.

By the way, in a state in which the second semiconductor chip 2 is mounted onto the first semiconductor chip 1, the four side portions measuring the chip mounting area 15, and the four side portions regulating the outer peripheral portion of the second semiconductor chip 2 are disposed in the same position in an ideal state free from the position shift or the like. For this reason, when the semiconductor device 100 is planarly viewed, the side portion 2A of the second semiconductor chip 2, and the side portion 15A of the chip mounting area 15 mean substantially the same side portion.

The introduction portion 18 is formed in a state in which the introduction portion 18 is connected to the side portion 15A of the chip mounting area 15 on the first semiconductor chip 1. In addition, the introduction portion 18 is formed in a slit-like shape in a direction intersecting with the X direction as the wiring direction of each of the wiring patterns 7. One end of the introduction portion 18 in the Y direction is connected to the side portion 15A of the chip mounting area 15. In addition, both the supply area 10 and the introduction portion 18 are disposed in a central portion (on a central line K) of the side portion 15A of the chip mounting area 15 in the X direction. The introduction portion 18 is formed in a state in which the introduction portion 18 overlaps the supply area 10. The introduction portion 18 is formed in a linear fashion (straight) from the supply area 10 of the underfill material 5 toward the side portion 15A of the chip mounting area 15.

A plurality of (ten in FIG. 4) wiring patterns 7 which are disposed immediately lateral to the side portion 15A of the chip mounting area 15 are interrupted so as to justify the end portions of those wiring patterns 7 in the X direction. Also, the interrupted portions are formed as the introduction portion 18. For this reason, any of the wiring patterns 7 is absent in the introduction portion 18. In addition, a surface of the passivation film 8 covering those wiring patterns 7 gets dented in a convex-like shape in a state in which the passivation film 8 continuously joints between the supply area 10 of the underfill material 5 and the side portion 15A of the chip mounting area 15. The dent portion concerned becomes the introduction portion 18. A depth (convex size) of the introduction portion 18 has the same size as that of the stepped portion 9 described above. A planar size of the introduction portion 18 has to be set in consideration of the viscosity and the flow property, and the wet spreading property on the surface of the first semiconductor chip 1 of the liquid underfill material 5 before the thermal curing which is used in the process for manufacturing the semiconductor device 100. Preferably, a width W of the introduction portion 18 is set as being equal to or larger than at least a thickness of the passivation film 8. In this case, as an example, the introduction portion 18 is formed so as to have the width of W=150 μm, and a length of L=500 μm.

When the semiconductor device 100 having the structure as described above is manufactured, firstly, in a process for manufacturing the first semiconductor chip 1, the introduction portion 18 is formed on the principal surface of the first semiconductor chip 1 by using the wiring pattern 7 and the passivation film 8 composing the uppermost layer. In addition, in a process for manufacturing the second semiconductor chip 2, a plurality of bumps 3 are formed on the surface of the second semiconductor chip 2. The bumps 3 may also be formed on the first semiconductor chip 1 side.

Figure 6:
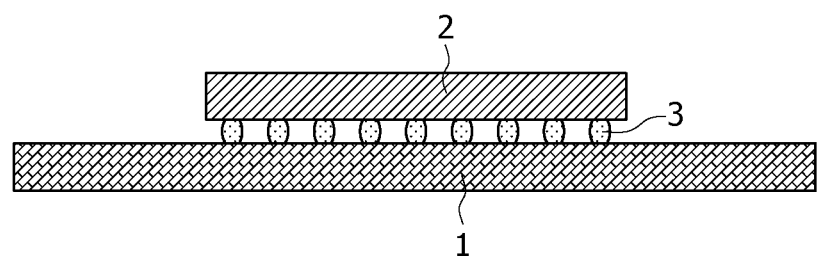
FIG. 6 is a cross sectional view (part 1) explaining a method of manufacturing the semiconductor device according to the embodiment of the present invention.

Next, the second semiconductor chip 2 obtained in the process for manufacturing the semiconductor chip 2 is mounted onto the first semiconductor chip 1 obtained in the process for manufacturing the first semiconductor chip 1 through the bumps 3 (refer to FIG. 6). At this time, the second semiconductor chip 2 is mounted so as for its position to correspond to the chip mounting area 15 set on the element formation surface of the first semiconductor chip 1. In this stage, there is obtained a state in which the air gap corresponding to the height of each of the bumps 3 is interposed between the first semiconductor chip 1 and the second semiconductor chip 2.

Figure 7:
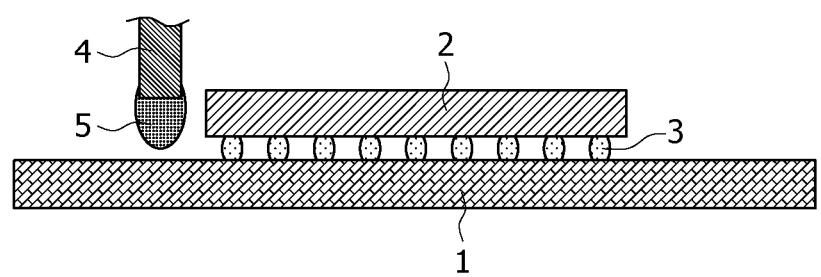
FIG. 7 is a cross sectional view (part 2) explaining the method of manufacturing the semiconductor device according to the embodiment of the present invention.
Figure 8:
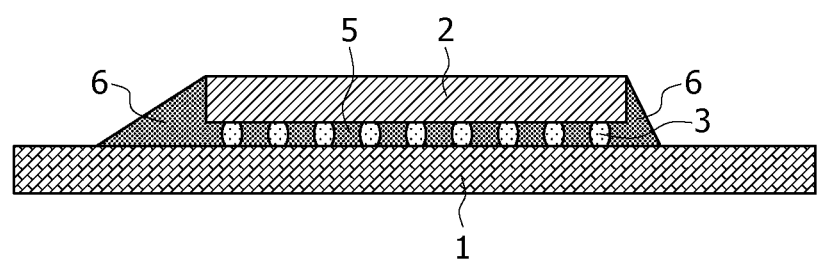
FIG. 8 is a cross sectional view (part 3) explaining the method of manufacturing the semiconductor device according to the embodiment of the present invention.

Next, as shown in FIG. 7, the liquid underfill material 5 is dropped from the needle 4 to be supplied onto the supply area 10 set on the first semiconductor chip 1, thereby filling the underfill material 5 (to the air gap) between the first semiconductor chip 1 and the second semiconductor chip 2. At this time, the underfill material 5 which has been supplied to the supply area 10 reaches the side portion 2A of the second semiconductor chip 2 through the introduction portion 18. The introduction portion 18 is formed in a flat state free from any of the stepped portions in the portion extending from the supply area 10 for the underfill material 5 to the side portion 15A of the chip mounting area 15 on the first semiconductor chip 1. For this reason, the underfill material 5 which has been supplied onto the supply area 10 is introduced to the side portion 2A of the second semiconductor chip 2 by the introduction portion 18. In addition, when the underfill material 5 reaches the side portion 2A of the second semiconductor chip 2, the underfill material 5 is drawn between the first semiconductor chip 1 and the second semiconductor chip 2 with the reaching as a trigger to penetrate to the air gap defined between the first semiconductor chip 1 and the second semiconductor chip 2 by the capillary action. The underfill material 5 which has penetrated to the air gap defined between the chips in such a manner, as shown in FIG. 8, forms the fillets 6 in the outer peripheral portion of the second semiconductor chip 2. After that, the underfill material 5 is thermally cured.

In the first embodiment of the present invention, the underfill material 5 which has been supplied onto the supply area 10 of the first semiconductor chip 1 is smoothly introduced to the side portion 2A of the second semiconductor chip 2 by the introduction portion 18 without impeding the flow of the underfill material 5 by the presence of the stepped portion. For this reason, a speed and an amount by which the underfill material 5 reaches the side portion 2A of the second semiconductor chip 2 become less in the dispersion as compared with the case where the underfill material 5 overcomes a number of stepped portions 9 to reach the side portion 2A of the second semiconductor chip 2. In addition, the underfill material 5 which has been supplied onto the supply area 10 of the first semiconductor chip 1 reaches the side portion 2A of the second semiconductor chip 2 in a shorter time, and penetrates from the side portion 2A of the second semiconductor chip 2 to the air gap defined between the chips by the capillary action. For this reason, an amount of underfill material 5 which has been supplied onto the supply area 10 is properly maintained as compared with either the case of the underfill material 5 wetly spreading on the first semiconductor chip 1, or the case of the underfill material 5 penetrating to the air gap defined between the chips. Therefore, the underfill material 5 which has been supplied onto the supply area 10 is prevented from being stranded on the second semiconductor chip 2. As a result, it is possible to prevent the generation of the voids, and the generation of stranding of the underfill material 5 on the second semiconductor chip 2.

3. Second Embodiment

Figure 9:
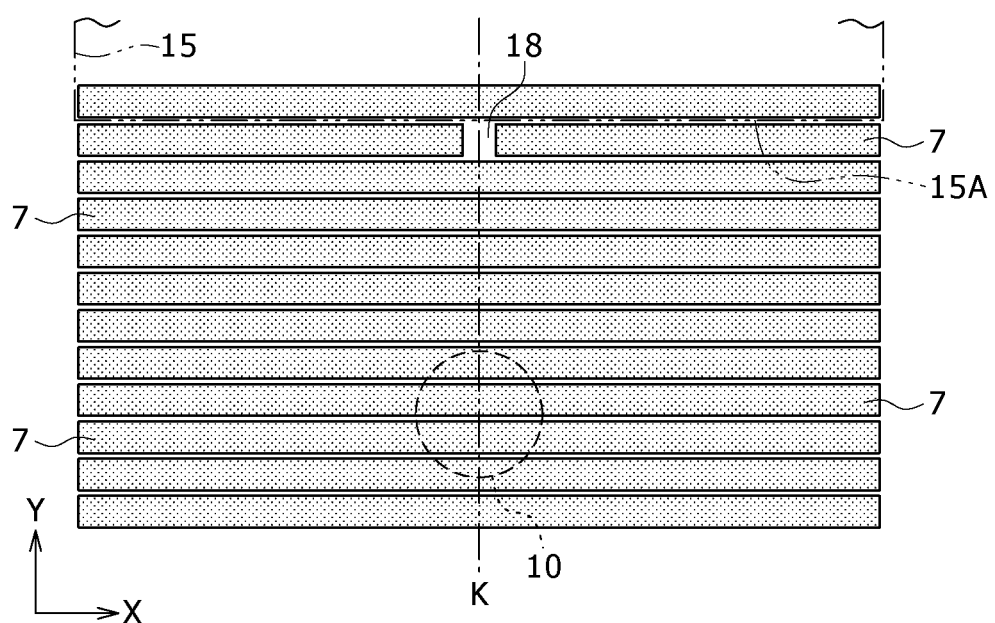
FIG. 9 is an enlarged top plan view of a part of an element formation surface of the first semiconductor chip before the second semiconductor chip is mounted in a structure of a semiconductor device according to a second embodiment of the present invention.

FIG. 9 is an enlarged top plan view of a part of an element formation surface of the first semiconductor chip 1 before the second semiconductor chip 2 is mounted in a structure of a semiconductor device according to a second embodiment of the present invention. The second embodiment is different in structure of the introduction portion 18 from the first embodiment. That is to say, the introduction portion 18 is formed in a state in which a part of one wiring pattern 7 which is located outside the wiring mounting area 15 set on the first semiconductor chip 1, and is closest to the side portion 15A of the chip mounting area 15 described above is cut away in a slot-like shape. The introduction portion 18 is formed outside the side portion 15A of the chip mounting area 15 along which the fillet 6 is formed so as to be longest similarly to the case of the first embodiment described above. In addition, the introduction portion 18 is formed in the slit-like shape in the direction intersecting with the wiring direction of the wiring pattern 7 similarly to the case of the first embodiment described above. Also, one end of the introduction portion 18 in the Y direction is formed so as to be connected to the side portion 15A of the chip mounting area 15.

In the second embodiment of the present invention, the underfill material 5 which has been supplied onto the supply area 10 of the first semiconductor chip 1 reaches the introduction portion 18 in a process in which the underfill material 5 wetly spreads on the first semiconductor chip 1. Also, the underfill material 5 is introduced to the side portion 2A of the second semiconductor chip 2 through the introduction portion 18. For this reason, the underfill material 5 which has been supplied onto the supply area 10 reaches the side portion 2A of the second semiconductor chip 2 in a short time as compared with the case where no introduction portion 18 is formed, and penetrates from the side portion 2A of the second semiconductor chip 2 to the air gap defined between the first semiconductor chip 1 and the second semiconductor chip 2 by the capillary action. Therefore, it is possible to prevent the generation of the voids, and the generation of stranding of the underfill material 5 on the second semiconductor chip 2.

4. Third Embodiment

Figure 10:
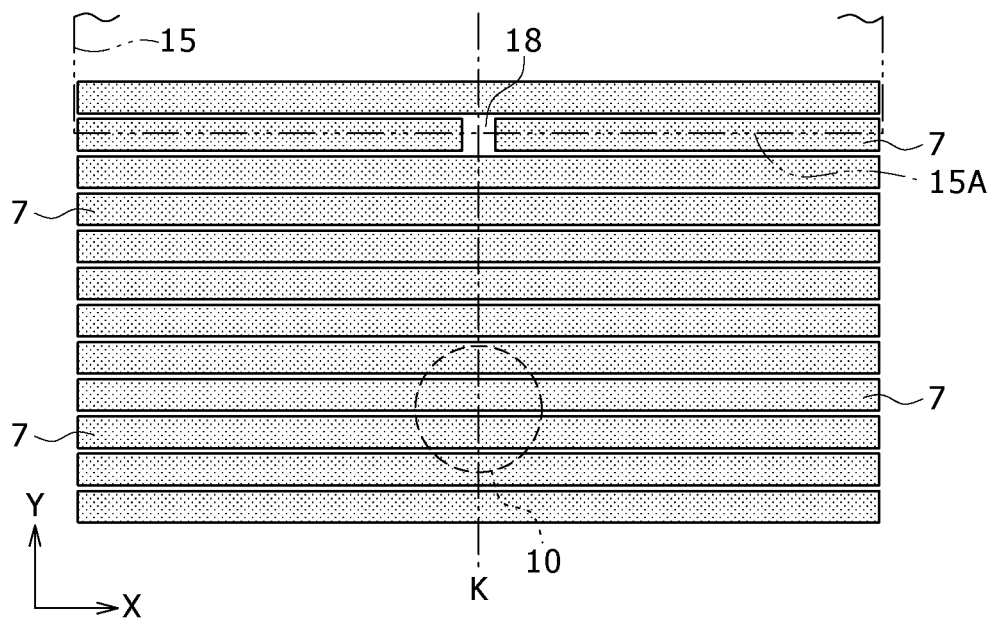
FIG. 10 is an enlarged top plan view of a part of an element formation surface of the first semiconductor chip before the second semiconductor chip is mounted in a structure of a semiconductor device according to a third embodiment of the present invention.

FIG. 10 is an enlarged top plan view of a part of an element formation surface of the first semiconductor chip 1 before the second semiconductor chip 2 is mounted in a structure of a semiconductor device according to a third embodiment of the present invention. The third embodiment is different in positional relationship between the side portion 15A of the chip mounting area 15, and the introduction portion 18 from the second embodiment described above. That is to say, although in the second embodiment described above, one end of the introduction portion 18 is disposed so as for its position to correspond to the side portion 15A of the chip mounting area 15, in the third embodiment, the introduction portion 18 is disposed so as to intersect with the side portion 15A of the chip mounting area 15. The form in which the introduction portion 18 is intersected with the side portion 15A of the chip mounting area 15 is realized by disposing one end of the introduction portion 18 inside the chip mounting area 15, and by disposing the other end of the introduction portion 18 outside the chip mounting area 15 in the Y direction.

In the third embodiment of the present invention, the underfill material 5 which has been supplied onto the supply area 10 of the first semiconductor chip 1 reaches the introduction portion 18 in a process in which the underfill material 5 wetly spreads on the first semiconductor chip 1. Also, the underfill material 5 is introduced to the side portion 2A of the second semiconductor chip 2 through the introduction portion 18. In this case, the underfill material 5 which has reached the introduction portion 18 is introduced to the inside of the chip mounting area 15, that is, to the inside of the area in which the first semiconductor chip 1 and the second semiconductor chip 2 faces each other by the introduction portion 18. For this reason, in addition to the same effect as that in the second embodiment described above, the following effect is obtained. That is to say, the drawing of the underfill material 5 by the capillary action can be promoted by the existence of the introduction portion 18. In addition, even when the mounting position of the second semiconductor chip 2 is shifted within a manufacture tolerance with respect to the chip mounting area 15 set on the first semiconductor chip 1, the underfill material 5 can be reliably introduced to the air gap defined between the first semiconductor chip 1 and the second semiconductor chip 2 through the introduction portion 18.

Figure 11:
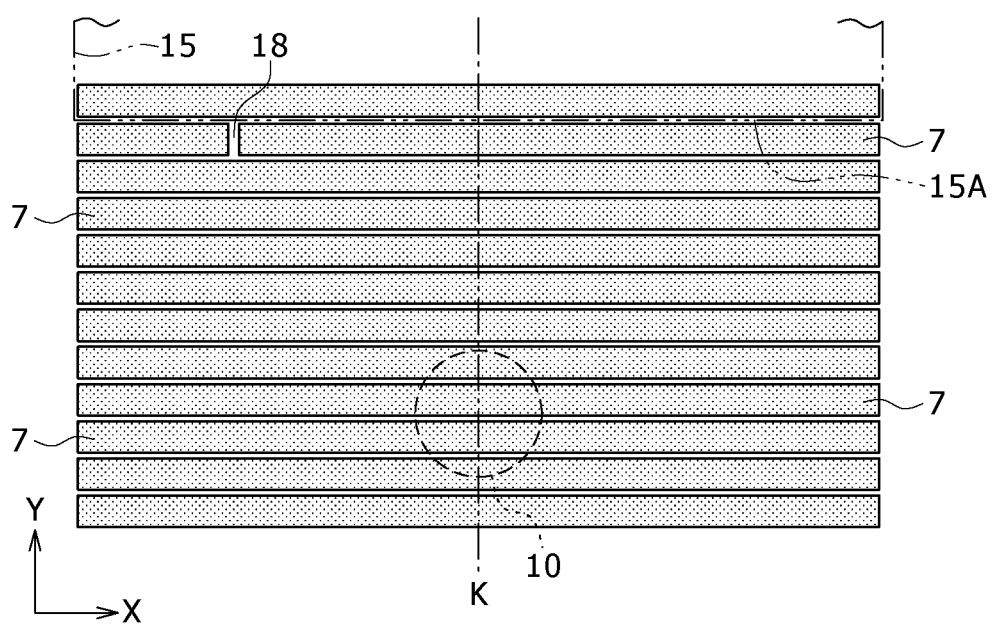
FIG. 11 is a top plan view showing a structure of a semiconductor device according to a change of the third embodiment of the present invention.

It is noted that although in the third embodiment of the present invention, the introduction portion 18 is formed in a central portion of the side portion 2A of the second semiconductor chip 2 in the X direction, the present invention is by no means limited thereto. For example, as shown in FIG. 11, the introduction portion 18 may also be formed in a position shifted from the central portion of the side portion 2A of the second semiconductor chip 2 in the X direction. In a word, the introduction portion 18 may be formed in any position within the range of the side portion 15A of the chip mounting area 15 in the X direction as long as a state is obtained in which one end of the introduction portion 18 either is connected to or intersects with the side portion 15A of the chip mounting area 15. This respect also applies to each of the first and second embodiments described above.

5. Fourth Embodiment

Figure 12:
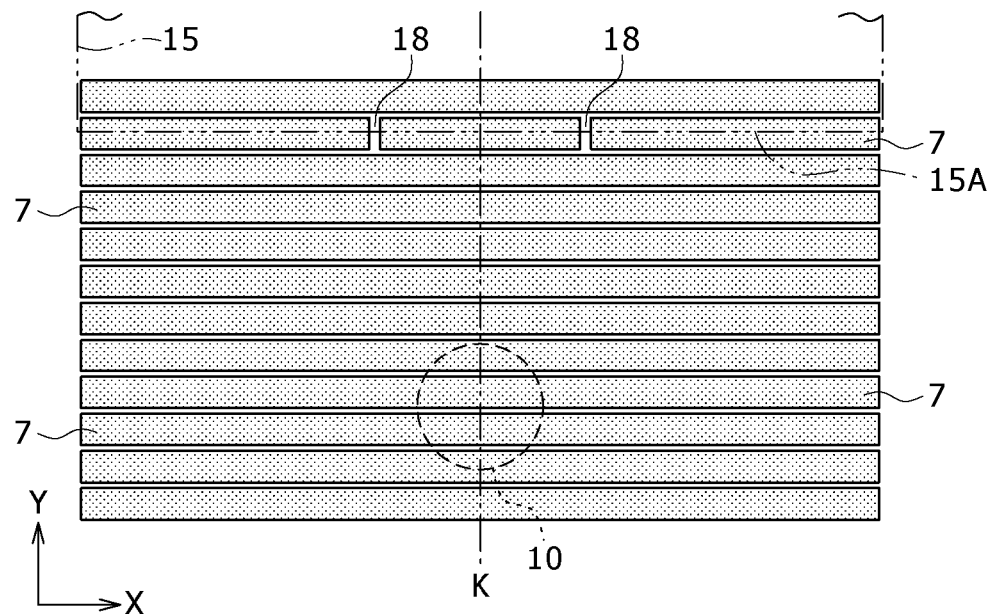
FIG. 12 is an enlarged top plan view of a part of an element formation surface of the first semiconductor chip before the second semiconductor chip is mounted in a structure of a semiconductor device according to a fourth embodiment of the present invention.

FIG. 12 is an enlarged top plan view of a part of an element formation surface of the first semiconductor chip 1 before the second semiconductor chip 2 is mounted in a structure of a semiconductor device according to a fourth embodiment of the present invention. The fourth embodiment is different in the number of introduction portions 18 from each of the first to third embodiments described above. That is to say, although in each of the first to third embodiments described above, only one introduction portion 18 is formed, in the fourth embodiment, two introduction portions 18 are formed with their positions being shifted in the X direction. The two introduction portions 18 are disposed in positions at distances horizontally equal to each other from the central portion of the side portion 15A of the chip mounting area 15 in the X direction. In addition, each of the two introduction portions 18 is formed so as to intersect with the side portion 15A of the chip mounting area 15.

In the fourth embodiment of the present invention, the underfill material 5 which has been supplied onto the supply area 10 of the first semiconductor chip 1 reaches each of the introduction portions 18 in a process in which the underfill material 5 wetly spreads on the first semiconductor chip 1. Also, the underfill material 5 is introduced to the side portion 2A of the second semiconductor chip 2 through each of the introduction portions 18. As a result, the underfill material 5 is introduced to the air gap defined between the first semiconductor chip 1 and the second semiconductor chip 2 in a simultaneous progression manner in a plurality of portions in the side portion 15A of the chip mounting area 15. For this reason, the generation of the voids, and the stranding of the underfill material 5 on the second semiconductor chip 2 can be effectively prevented.

6. Fifth Embodiment

Figure 13:
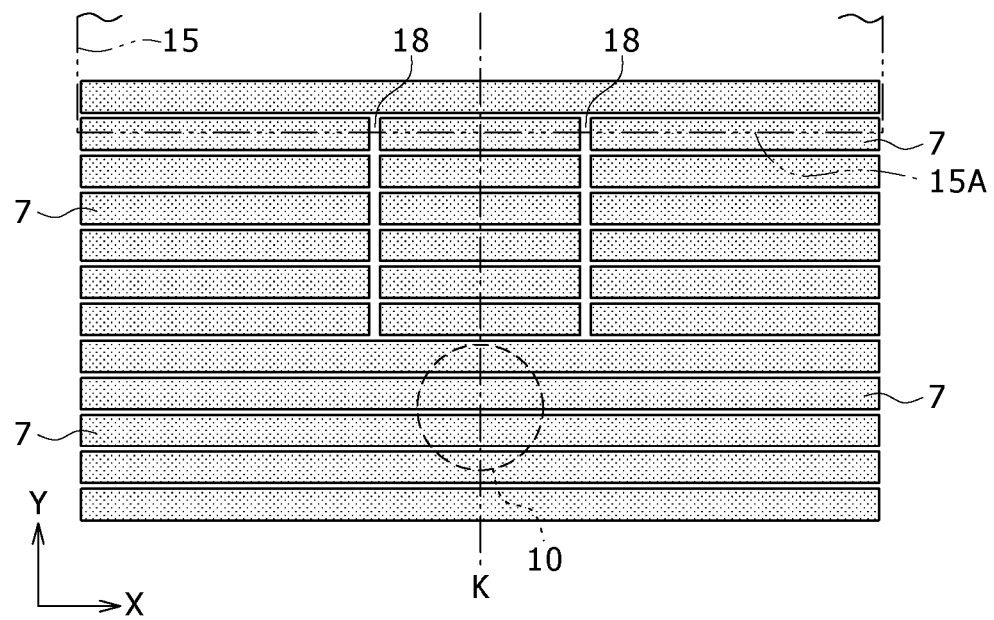
FIG. 13 is an enlarged top plan view of a part of an element formation surface of the first semiconductor chip before the second semiconductor chip is mounted in a structure of a semiconductor device according to a fifth embodiment of the present invention.

FIG. 13 is an enlarged top plan view of a part of an element formation surface of the first semiconductor chip 1 before the second semiconductor chip 2 is mounted in a structure of a semiconductor device according to a fifth embodiment of the present invention. The fifth embodiment is different in length of the introduction portion 18 in the Y direction from the fourth embodiment described above. That is to say, in the fourth embodiment described above, one wiring pattern 7 is cut away into the slit-like shape in the two portions in the X direction, thereby forming the two introduction portions 18. On the other hand, in the fifth embodiment, each of multiple wiring patterns 7 arranged in the Y direction is cut away into the slit-like shape in two portions in the X direction, whereby two introduction portions 18 are long formed in a narrow groove-like shape. Although in the case shown in FIG. 13, six wiring patterns 7 are each cut away in the slit-like shape, the number of wiring patterns 7 which are each cut away in the slit-like shape is by no means limited to six, the number may also be equal to or larger than two, and equal to or smaller than five, or may also be seven or more.

In the fifth embodiment of the present invention, the underfill material 5 which has been supplied onto the supply area 10 of the first semiconductor chip 1 reaches each of the introduction portions 18 in the process in which the underfill material 5 wetly spreads on the first semiconductor chip 1. In this case, each of the introduction portions 18 is formed in a linear fashion toward the side portion 15A of the chip mounting area 15 so as to cross through a plurality of wiring patterns 7. For this reason, the underfill material 5 which has wetly spread from the supply area 10 reaches each of the introduction portion 18 earlier than that in the case of the fourth embodiment. Also, the underfill material 5 which has reached each of the introduction portions 18 is quickly introduced to the side portion 2A of the second semiconductor chip 2 along each of the introduction portions 18. Therefore, the generation of the voids, and the stranding of the underfill material 5 on the second semiconductor chip 2 can be effectively prevented.

It is noted that although in each of the fourth and fifth embodiments described above, each of the introduction portions 18 is formed so as to intersect with the side portion 15A of the chip mounting area 15, the present invention is by no means limited thereto. For example, each of the introduction portions 18 may also be formed in a state in which each of one ends of the introduction portions 18 is connected to the side portion 15A of the chip mounting area 15 similarly to the case of each of the first and second embodiments described above.

In addition, although in each of the fourth and fifth embodiments described above, the two introduction portions 18 are formed, three or more introduction portions 18 may also be formed. In addition, when three introduction portions 18 are formed, preferably, there is adopted such a form that one introduction portion 18 is disposed in the central portion of the side portion 15A of the chip mounting area 15 in the X direction, and two introduction portions 18 are disposed in respective positions at distances horizontally equal to each other from the central portion of the side portion 15A of the chip mounting area 15 in the X direction.

7. Sixth Embodiment

Figure 14:
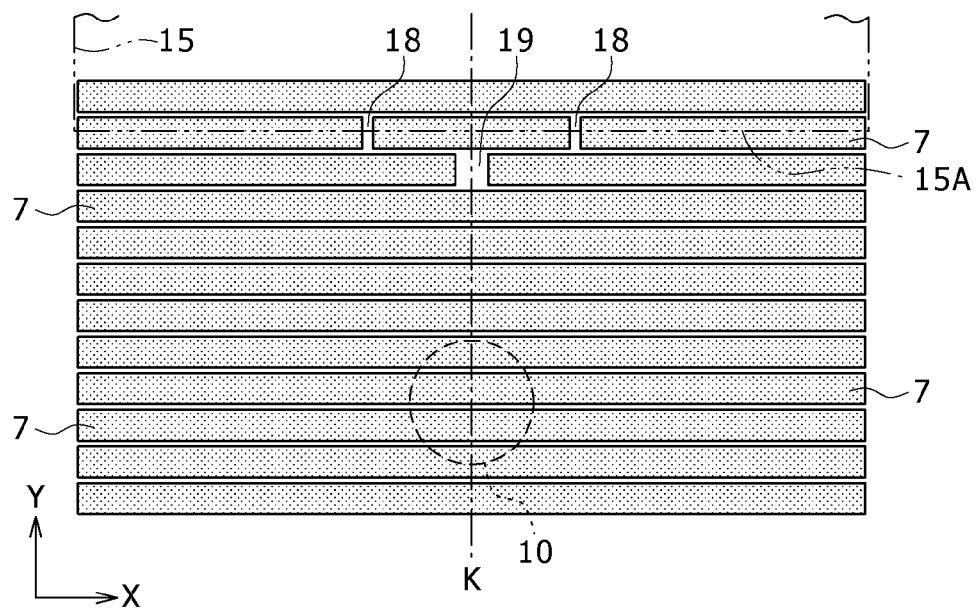
FIG. 14 is an enlarged top plan view of a part of an element formation surface of the first semiconductor chip before the second semiconductor chip is mounted in a structure of a semiconductor device according to a sixth embodiment of the present invention.
Figure 15:
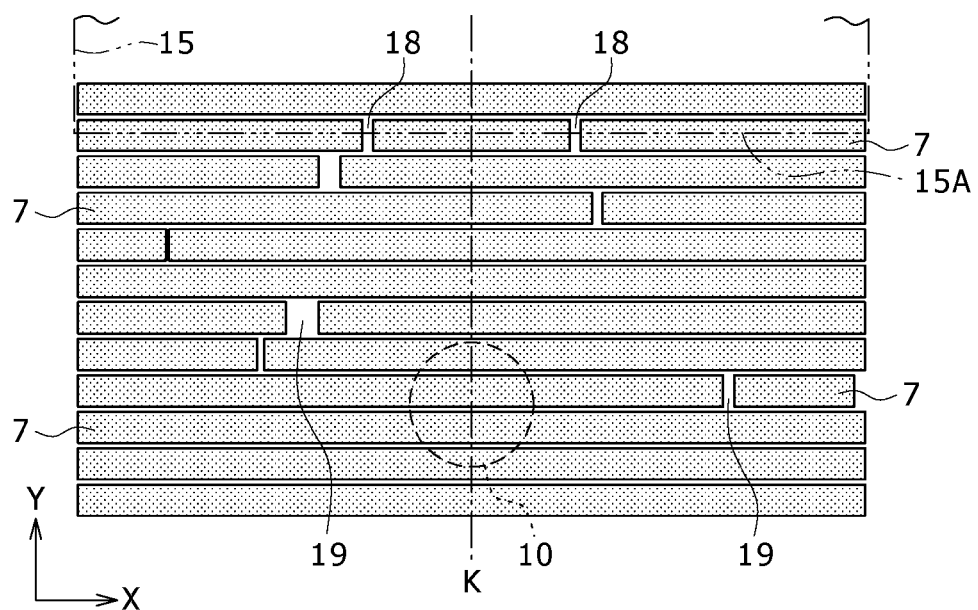
FIG. 15 is a top plan view showing a structure of a semiconductor device according to a change of the sixth embodiment of the present invention.

FIG. 14 is an enlarged top plan view of a part of an element formation surface of the first semiconductor chip 1 before the second semiconductor chip 2 is mounted in a structure of a semiconductor device according to a sixth embodiment of the present invention. The sixth embodiment is different from the fourth embodiment described above in that a subsidiary introduction portion 19 is formed outside the side portion 15A of the chip mounting area 15 in a state in which no subsidiary introduction portions 19 is connected to the side portion 15A (in a separation state). Similarly to the case of each of the introduction portions 18, the subsidiary introduction portion 19 is formed in a state in which a part of corresponding one of the wiring patterns 7 is cut away in the slit-like shape. In introducing the underfill material 5 to the air gap defined between the first embodiment chip 1 and the second semiconductor chip 2 through each of the introduction portions 18, the subsidiary introduction portion 19 is formed for subsidizing the introduction of the underfill material 5. The subsidiary introduction portion 19 operates to locally promote the flow of the underfill material 5 in the Y direction when the underfill material 5 supplied onto the supply area 10 wetly spreads on the first semiconductor chip 1. The subsidiary introduction portion 19 may be formed in arbitrary one portion in the X direction and in the Y direction. Or, for example, as shown in FIG. 15, the subsidiary introduction portions 19 may also be formed in a plurality of arbitrary portions. In addition, the slit widths of the subsidiary introduction portions 19 may also be arbitrarily changed.

In the sixth embodiment of the present invention, the underfill material 5 which has been supplied onto the supply area 10 of the first semiconductor chip 1 wetly spreads on the first semiconductor chip 1 via the subsidiary introduction portion 19, whereby the underfill material 5 earlier reaches each of the introduction portions 18, and the side portion 2A, of the second semiconductor chip 2, connected to each of the introduction portions 18. For this reason, the underfill material 5 can be made to reach the side portion 2A of the semiconductor chip 2 in a short time as compared with the case where none of the subsidiary introduction portions 19 is formed.

8. Seventh Embodiment

Figure 16:
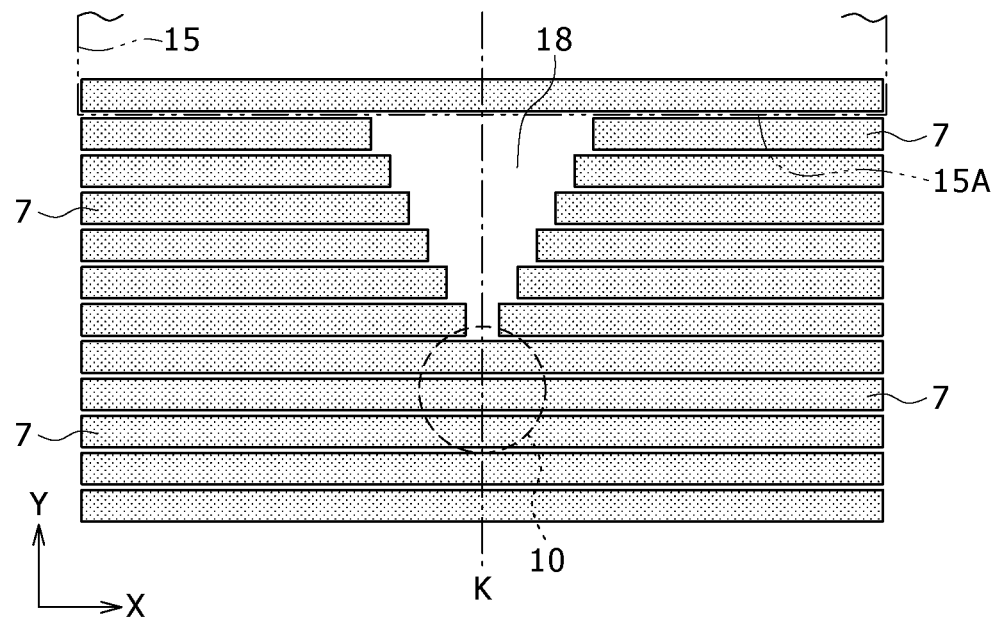
FIG. 16 is an enlarged top plan view of a part of an element formation surface of the first semiconductor chip before the second semiconductor chip is mounted in a structure of a semiconductor device according to a seventh embodiment of the present invention.

FIG. 16 is an enlarged top plan view of a part of an element formation surface of the first semiconductor chip 1 before the second semiconductor chip 2 is mounted in a structure of a semiconductor device according to a seventh embodiment of the present invention. The seventh embodiment is different in planar shape of the introduction portion 18 from the first embodiment described above. That is to say, although in the first embodiment described above, the introduction portion 18 is formed in a linear fashion, in the seventh embodiment, the introduction portion 18 is formed in a folding-fan shape. More specifically, the introduction portion 18 is formed in the folding-fan shape from the supply area 10 onto which the underfill material 5 is supplied toward the side portion 15A of the chip mounting area 15 on the first semiconductor chip 1. The wiring pattern 7 which is located outside the side portion 15A of the chip mounting area 15 and is closest to the chip mounting area 15 is most widely cut away, and a cutaway width of the wiring pattern 7 is gradually narrowed as the distance from that wiring pattern 7 increases, thereby realizing the folding-fan shape. Although the number of wiring patterns 7 with which the introduction portion 18 having the folding-fan shape is formed is six in the Y direction in the case shown in FIG. 16, the present invention is by no means limited thereto. That is to say, the number may also be equal to or larger than two and equal to or smaller than five, or may also be seven or more. In addition, in the X direction, preferably, the introduction portion 18 is formed in the folding-fan shape in the central portion of the side portion 15A of the chip mounting area 15.

In the seventh embodiment of the present invention, in addition to the same effect as that in the first embodiment described above, the following effect is obtained. That is to say, the underfill material 5 which has been supplied onto the supply area 10 of the first semiconductor chip 1 reaches the introduction portion 18 in the process in which the underfill material 5 wetly spreads on the first semiconductor chip 1. At this time, the underfill material 5 which has reached the introduction portion 18 flows within the introduction portion 18 from the cutaway portion of the wiring pattern 7 which is most narrowly cut away toward the cutaway portion of the wiring pattern 7 which is most widely cut away. For this reason, the underfill material 5 smoothly flows within the introduction portion 18. In addition, the underfill material 5 penetrates to the air gap defined between the first semiconductor chip 1 and the second semiconductor chip 2 with the widest portion of the introduction portion 18 as a starting point in the process in which the underfill material 5 is introduced from the introduction portion 18 to the side portion 2A of the semiconductor chip 2. For this reason, the underfill material 5 can be made to quickly penetrate to the air gap defined between the first semiconductor chip 1 and the second semiconductor chip 2.

It is noted that although in FIG. 16, the wiring pattern 7 which is most widely cut away is disposed along the side portion 15A of the chip mounting area 15, thereby connecting a part of the introduction portion 18 to the side portion 15A of the chip mounting area 15, the present invention is by no means limited thereto. For example, although not illustrated, there may also be adopted such a form that the wiring pattern 7 which is most widely cut away is disposed so as to overlap the side portion 15A of the chip mounting area 15, thereby intersecting a part of the introduction portion 18 with the side portion 15A of the chip mounting area 15.

9. Eighth Embodiment

Figure 17:
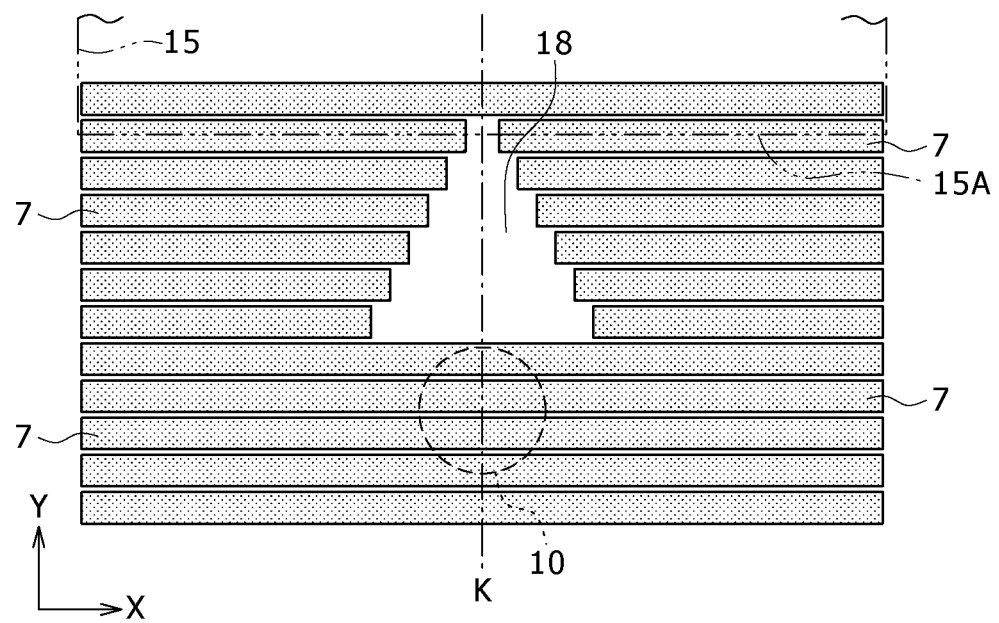
FIG. 17 is an enlarged top plan view of a part of an element formation surface of the first semiconductor chip before the second semiconductor chip is mounted in a structure of a semiconductor device according to an eighth embodiment of the present invention.

FIG. 17 is an enlarged top plan view of a part of an element formation surface of the first semiconductor chip 1 before the second semiconductor chip 2 is mounted in a structure of a semiconductor device according to an eighth embodiment of the present invention. The eighth embodiment is different in planar shape of the introduction portion 18 from the seventh embodiment described above. That is to say, in the seventh embodiment described above, the introduction portion 18 is formed in the folding-fan shape spread from the supply area 10 onto which the underfill material 5 is supplied toward the side portion 15A of the chip mounting area 15 on the first semiconductor chip 1. On the other hand, in the eighth embodiment, the introduction portion 18 is formed in a tapering-off shape (vanishing shape) from the supply area 10 onto which the underfill material 5 is supplied toward the side portion 15A of the chip mounting area 15 on the first semiconductor chip 1. The wiring pattern 7 which is located outside the side portion 15A of the chip mounting area 15 and is closest to the chip mounting area 15 is most narrowly cut away, and a cutaway width of the wiring pattern 7 is gradually widened as the distance from the wiring pattern 7 increases, thereby realizing the tapering-off shape. Although the number of wiring patterns 7 with which the introduction portion 18 having the tapering-off shape is formed is six in the Y direction in the case shown in FIG. 17, the present invention is by no means limited thereto. That is to say, the number may also be equal to or larger than two and equal to or smaller than five, or may also be seven or more. In addition, in the X direction, preferably, the introduction portion 18 is formed in the tapering-off shape in the central portion of the side portion 15A of the chip mounting area 15.

In the eighth embodiment of the present invention, in addition to the same effect as that in the first embodiment described above, the following effect is obtained. That is to say, the underfill material 5 which has been supplied onto the supply area 10 of the first semiconductor chip 1 reaches the introduction portion 18 in the process in which the underfill material 5 wetly spreads on the first semiconductor chip 1. At this time, the underfill material 5 which has reached the introduction portion 18 flows within the introduction portion 18 from the cutaway portion of the wiring portion 7 which is most widely cut away toward the cutaway portion of the wiring portion 7 which is most narrowly cut away. For this reason, a speed at which the underfill material 5 flows through the introduction portion 18 increases. Therefore, the underfill material 5 which has reached the introduction portion 18 can be quickly introduced to the side portion 2A of the second semiconductor chip 2.

It is noted that although in FIG. 17, the wiring pattern 7 which is most narrowly cut away is disposed so as to overlap the side portion 15A of the chip mounting area 15, thereby intersecting through a part of the introduction portion 18 with the side portion 15A of the chip mounting area 15, the present invention is by no means limited thereto. For example, although not illustrated, there may also be adopted such a form that the wiring pattern 7 which is mostly narrowly cut away is disposed along the side portion 15A of the chip mounting area 15, thereby connecting a part of the introduction portion 18 to the side portion 15A of the chip mounting area 15.

10. Ninth Embodiment

Figure 18:
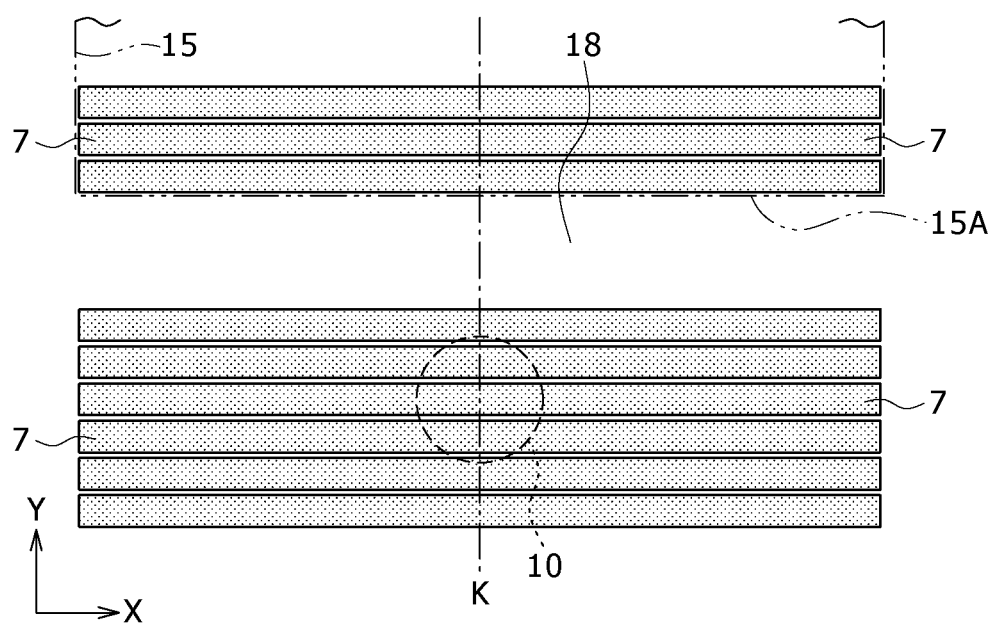
FIG. 18 is an enlarged top plan view of a part of an element formation surface of the first semiconductor chip before the second semiconductor chip is mounted in a structure of a semiconductor device according to a ninth embodiment of the present invention.

FIG. 18 is an enlarged top plan view of a part of an element formation surface of the first semiconductor chip 1 before the second semiconductor chip 2 is mounted in a structure of a semiconductor device according to a ninth embodiment of the present invention. In the ninth embodiment of the present invention, the introduction portion 18 is formed so as to be connected to the entire side portion 15A (entire area) of the chip mounting area 15 in the X direction as the wiring direction of the wiring pattern 7. Preferably, a size of the introduction portion 18 in the Y direction is set as being equal to or larger than at least ⅓ of a chip thickness of the second semiconductor chip 2. In addition, a maximum value (uppermost value) of the size of the introduction portion 18 in the Y direction, for example, has to be regulated under such a condition that the supply area 10 of the underfill material 5 is perfectly fitted within the introduction portion 18. Specifically, the maximum value of the size of the introduction portion 18 in the Y direction has to be regulated with a value obtained by adding a size (outer diameter) of the supply area 10 to a separation distance from the side portion 15A of the chip mounting area 15 to the supply area 10 of the underfill material 5.

In the ninth embodiment of the present invention, the underfill material 5 which has been supplied onto the supply area 10 of the first semiconductor chip 1 reaches the introduction portion 18 in the process in which the underfill material 5 wetly spreads on the first semiconductor chip 1. At this time, when the introduction portion 18 is formed so as to be connected to the entire side portion 15A of the chip mounting portion 15, the underfill material 5 is introduced to the side portion 2A of the second semiconductor chip 2 through the wide introduction portion 18 without impeding the flow of the underfill material 5 which has reached the wide introduction portion 18. In addition, the underfill material 5 is introduced from the entire side portion 2A of the second semiconductor chip 2 to the air gap defined between the first semiconductor chip 1 and the second semiconductor chip 2 by the capillary action. For this reason, the generation of the voids, and the stranding of the underfill material 5 on the second semiconductor chip 2 can be effectively prevented.

It is noted that although in FIG. 18, one end of the introduction portion 18 in the Y direction is disposed along the side portion 15A of the chip mounting area 15, thereby connecting the introduction portion 18 to the side portion 15A of the chip mounting area 15, the present invention is by no means limited thereto. For example, although not illustrated, there may also be adopted such a form that one end portion side of the introduction portion 18 is disposed so as to overlap the side portion 15A of the chip mounting area 15 in the Y direction, thereby intersecting the introduction portion 18 with the side portion 15A of the chip mounting area 15.

11. Changes

In each of the first to ninth embodiments described above, the introduction portion 18 is provided outside the side portion 2A of the second semiconductor chip 2, whereby the underfill material 5 can be smoothly introduced to the air gap defined between the first semiconductor chip 1 and the second semiconductor chip 2 without impeding the flow of the underfill material 5 by the presence of the stepped portion.

However, it is thought that with regards to the underfill material 5 as well introduced to the air gap defined between the first semiconductor chip 1 and the second semiconductor chip 2, the flow property thereof is impeded by the surface tension in the stepped portion similarly to the process until the underfill material 5 is introduced to the air gap defined between the chips. Also, when the flow property of the underfill material 5 introduced to the air gap defined between the chips is impeded, it is difficult for the underfill material 5 to reach any of the side portions other than the side portion 2A. Thus, the length of the fillet 6 in any of the side portions other than the side portion 2A may become insufficient.

Figure 19:
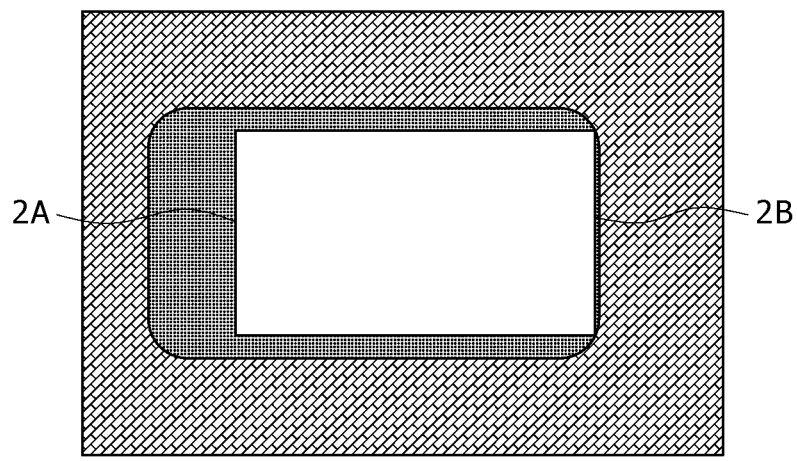
FIG. 19 is a schematic view explaining a change of any of the first to ninth embodiments of the present invention.
Figure 20:
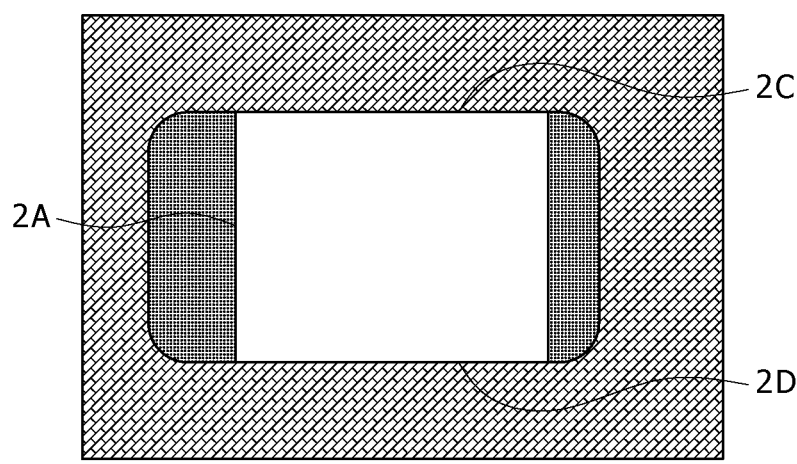
FIG. 20 is a schematic view explaining another change of any of the first to ninth embodiments of the present invention.
Figure 21:
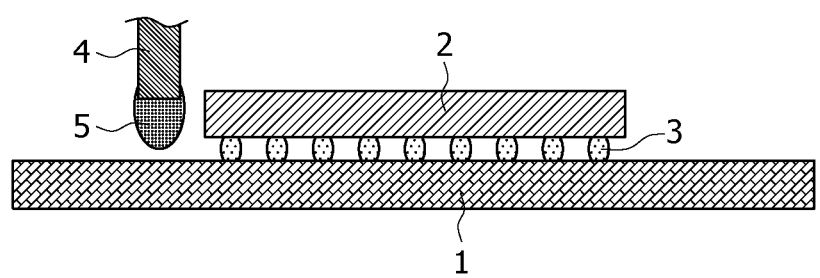
FIG. 21 is a cross sectional view showing an example of a process for enclosing an underfill material.
Figure 22A:
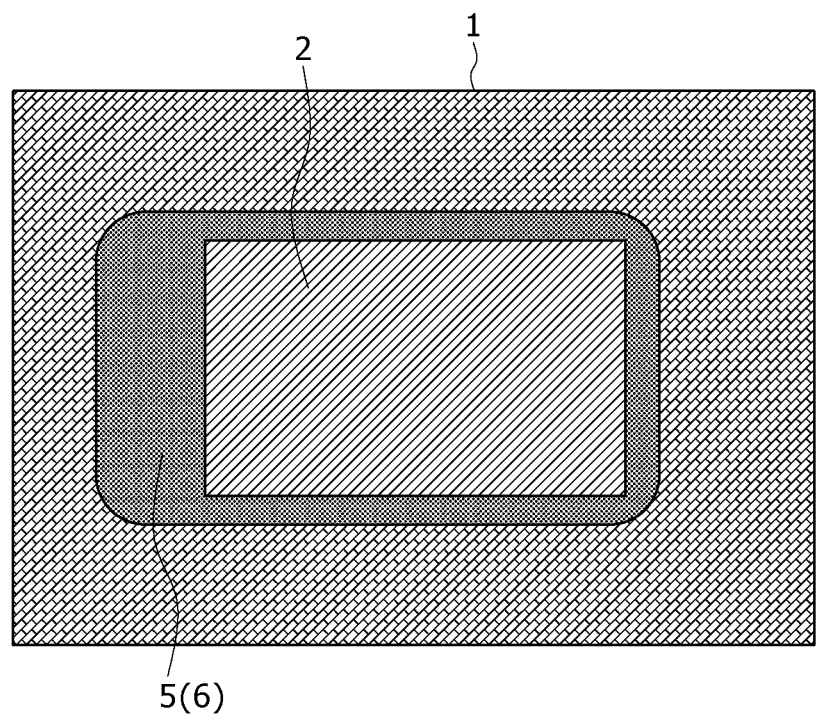
FIGS. 22A and 22B are a top plan view and a cross sectional view, respectively, each showing a state in which fillets are formed by filling the underfill material.
Figure 22B:
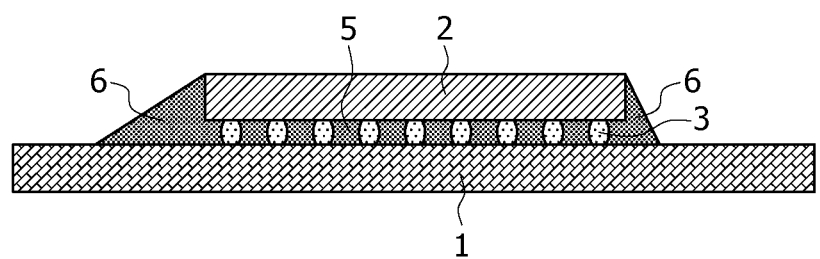
Figure 23:
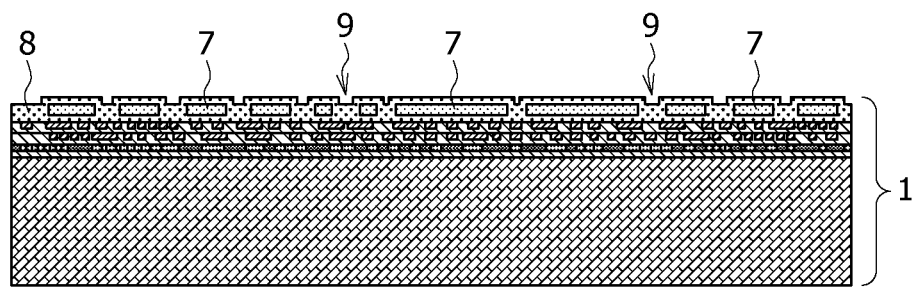
FIG. 23 is a cross sectional view showing a structure of a semiconductor chip.
Figure 25:
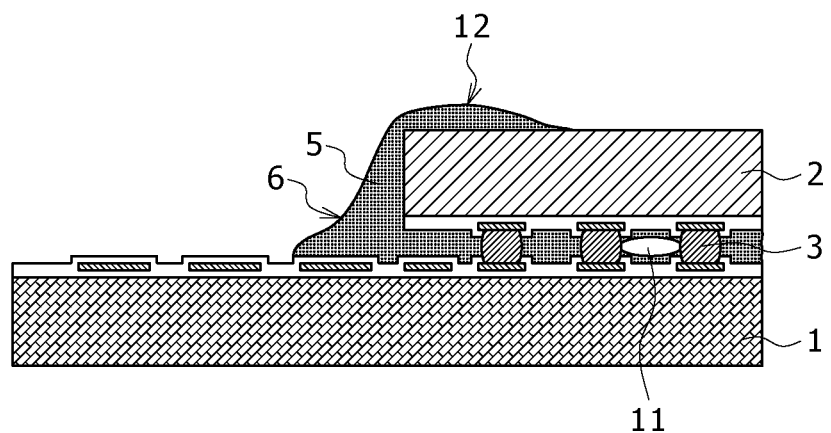
FIG. 25 is a cross sectional view (part 1) explaining an existing problem.
Figure 26:
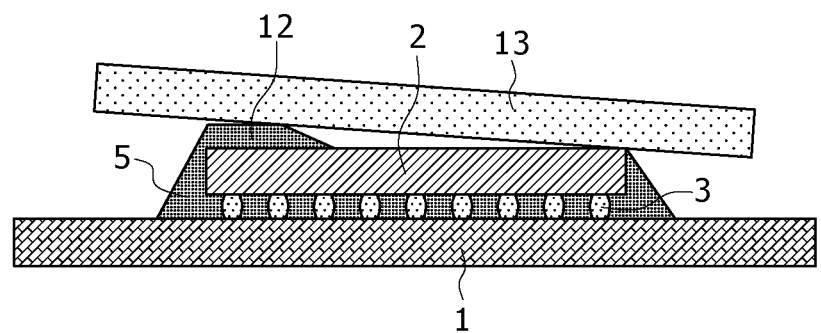
FIG. 26 is a cross sectional view (part 2) explaining an existing problem.

For example, FIG. 19 shows the case where the length of the fillet 6 in the side portion 2B facing the side portion 2A is insufficient, and FIG. 20 shows the case where each of the lengths of the fillets 6 in the side portions 2C and 2D each disposed in a direction vertical to the side portion 2A is insufficient. It is noted that when each of the lengths of the fillets 6 is sufficient, the structure as shown in FIG. 1 is obtained. Here, it is thought that when the wiring direction of the wiring patterns 7, and the flow direction of the underfill material 5 are orthogonal to each other, the phenomenon shown in FIG. 19 is easy to generate. On the other hand, it is thought that when the wiring direction of the wiring patterns 7, and the flow direction of the underfill material 5 are identical to each other, the phenomenon shown in FIG. 20 is easy to generate.

Now, the fillets 6 are necessary for protecting the end portions of the second semiconductor chip 2 with the underfill material 5, thereby enhancing the reliability of the product after completion of the assembly of the package. For example, it is feared that the thermal stress due to a difference in thermal expansion coefficient between the materials composing the semiconductor package is generated in the semiconductor package owing to the heat generation from the heating treatment in a phase of the mounting or from the semiconductor device in operation, and as a result, the fault such as the peeling of the wiring layer from the end surface of the second semiconductor chip 2 is generated. Therefore, each of the lengths of the fillets 6 needs to be sufficiently ensured for enhancing the product reliability.

For this reason, for sufficiently ensuring the length of the fillet 6 in the side portion 2B, preferably, the slit(s) (each) having the same structure as that of (each of) the introduction portion(s) 18 shown in any of FIGS. 9 to 12 is(are) formed outside the side portion 2B. Likewise, for sufficiently ensuring the length of the fillet 6 in the side portion 2C, preferably, the slit(s) (each) having the same structure as that of (each of) the introduction portion(s) 18 shown in any of FIGS. 9 to 12 is(are) formed outside the side portion 2C. In addition, for sufficiently ensuring the length of the fillet 6 in the side portion 2D, preferably, the slit(s) (each) having the same structure as that of (each of) the introduction portion(s) 18 shown in any of FIGS. 9 to 12 is(are) formed outside the side portion 2D. Here, each of the slits formed outside the side portions 2B, 2C and 2D, respectively, is an example of a derivation portion.

It is noted that when the slits are formed outside the side portions 2B, 2C and 2D, respectively, the lengths of the fillets can be sufficiently ensured in all the side portions such as the side portions 2A, 2B, 2C and 2D, respectively. Therefore, the very high product reliability can be expected.

Now, the inventors of this application manufactured a large variety of semiconductor devices different in fillet length from one another, and carried out a temperature cycling test in which for the semiconductor devices, a temperature change between −25° C. and 125° C. was repeated by 2,000 times. As a result, the inventors of this application obtained such a knowledge that preferably, the length of the fillet 6 is equal to or larger than 100 μm. It is noted that the values of properties of materials, and conditions of the underfill material used in the temperature cycling test are as follows.

Air gap between upper and lower chips: 15 μm to 30 μm
Uppermost layers of upper and lower chips: silicon nitride
Injection temperature of underfill material: 70° C. to 110° C.
Filler maximum grain diameter: 1 μm
Content: 50 to 60%
Glass transition temperature: 120° C. to 140° C.
Viscosity: 8 to 20 Pa·s
Thermal expansion coefficient (before curing): $30 \times 10^{-5}$ to $40 \times 10^{-5}$
Thermal expansion coefficient (after curing): $120 \times 10^{-5}$ to $140 \times 10^{-5}$
Poisson's ratio: 0.35
Application speed: 0.1 mg/sec In addition, the inventors of this application repeated the further experiments, and as a result, it was found out that when the slit is provided in the outside portion located within 100 μm from the end of the second semiconductor chip 2 with respect to each of the side portions 2B, 2C and 2D of the second semiconductor chip 2, the length of the fillet becomes equal to or larger than 100 μm.

As described above, the slit is provided in the side portion 2B, 2C or 2D, whereby the fillet having the length equal to or larger than 100 μm can be formed in any of the side portions as well other than the side portion 2A. As a result, for example, it is possible to prevent the peel-off of the wiring layer generated from the end of the second semiconductor chip 2 due to the thermal stress, and so forth. Thus, it is possible to enhance the long-term reliability of the semiconductor devices.

In addition, since the penetration of the underfill material 5 is not impeded in the end portion as well of the second semiconductor chip 2, it is possible to suppress the generation of the voids in the underfill material 5 filled in the air gap defined between the upper and lower chips. Likewise, since the penetration of the underfill material 5 is not impeded, it is possible to effectively inhibit the stranding of the underfill material 5 on the second semiconductor chip 2 in the application position of the underfill material 5.

It is noted that an amount of underfill material 5 suitable for being filled in the air gap defined between the upper and lower chips is supplied, whereby the length of the fillet 6 equal to or larger than 100 μm can be reliably ensured in each of the side portions 2A, 2B, 2C and 2D. For this reason, the lengths of the fillers 6 in the side portions are measured after completion of the supply of the underfill material 5, whereby it is possible to detect a lack of the underfill material 5 due to the dispersion of the air gap defined between the upper and lower chips, or the dispersion of the amount of application in the semiconductor device. This also means that it is possible to inhibit the defective product which is lacking in the filling of the underfill material 5 from being sent to the next process to be leaked to the market.

It is noted that a method of manufacturing a semiconductor device of the present invention is embodied as described with reference to FIGS. 6 to 8.

The present application contains subject matter related to that disclosed in Japanese Priority Patent Application JP 2010-010091 filed in the Japan Patent Office on Jan. 20, 2010, and Japanese Priority Patent Application JP 2009-010786 filed in the Japan Patent Office on Jan. 21, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor device, comprising:
   a mount body having a principal surface side with a wiring pattern formed on the principal surface side of the mount body;
   a passivation film formed on the principal surface side of the mount body and covering the wiring pattern, wherein the passivation film includes a stepped portion corresponding to wirings in the wiring pattern;
   a semiconductor chip mounted above the principal surface side of said mount body with said wiring pattern;
   a plurality of bumps, wherein the semiconductor chip is electrically and mechanically connected to the mount body by the bumps;
   an underfill material filled between said mount body and said semiconductor chip, thereby forming fillet in an outer peripheral portion of said semiconductor chip, wherein the underfill material lies between the semiconductor chip and the passivation film;
   an introduction portion formed in the passivation film formed on the principal surface of the mount body that is operable to route said underfill material between said mount body and said semiconductor chip,
   wherein the introduction portion is a convex-like shape formed on the principal surface side of the mount body, wherein the convex-like shape of the introduction portion is formed in a surface of the passivation film,
   wherein at least a first portion of the introduction portion lies in a first area between the mount body and the semiconductor chip, and
   wherein at least a second portion of the introduction portion lies in a second area that is not between the mount body and the semiconductor chip; and
   a derivation portion provided outside at least one side portion of three side portions except for the side portion outside which said introduction portion is formed, said derivation portion serving to introduce said underfill material introduced between said mount body and said semiconductor chip to an outer peripheral portion of said semiconductor chip.

2. The semiconductor device according to claim 1, further comprising:
   a derivation portion provided outside each of three side portions except for the side portion outside which said introduction portion is formed, said derivation portion serving to introduce said underfill material introduced between said mount body and said semiconductor chip to an outer peripheral portion of said semiconductor chip.

3. The semiconductor device according to claim 1, wherein said introduction portion is formed along a line that is connected to or that intersects with a longest side of a chip mounting area.

4. The semiconductor device according to claim 3, wherein,
   said wiring pattern is formed outside the longest side portion of said chip mounting area along which said fillet is formed so that the wiring pattern has a longest dimension that is parallel to the longest side of the chip mounting area; and
   said introduction portion is formed so as to either be connected to or intersect with a part of the side portion of said chip mounting area in a wiring direction of said wiring pattern.

5. The semiconductor device according to claim 4, wherein the convex-like shape of the introduction portion has a long axis that lies along a direction that intersects a long axis of the wiring direction of the wiring pattern.

6. The semiconductor device according to claim 5, wherein a plurality of introduction portions are formed with their positions being shifted in the wiring direction of said wiring pattern.

7. The semiconductor device according to claim 3, wherein,
   said wiring pattern is formed outside the side portion of said chip mounting area along which said fillet is formed in parallel to a longest side portion of the chip mounting area; and
   said introduction portion is formed so as to either be connected to or intersect with all of the side portion of said chip mounting area in a wiring direction of said wiring pattern.

8. The semiconductor device according to claim 1, wherein the wiring pattern formed on the principal surface includes a plurality of wirings that each extend in a first direction, and wherein the introduction portion formed in the surface of the passivation film extends in a second direction that intersects the first direction.

9. The semiconductor device according to claim 8, wherein no part of the introduction portion lies between the wiring pattern and the semiconductor chip.

10. The semiconductor device according to claim 1, wherein the derivation portion includes a slit.

11. The semiconductor device according to claim 1, wherein at least part of the second portion of the introduction portion includes a supply area.

12. The semiconductor device according to claim 1, wherein the introduction portion formed in the passivation film does not overlap the stepped portion of the passivation film.

* * * * *